US006938236B1

(12) United States Patent
Park et al.

(10) Patent No.: US 6,938,236 B1
(45) Date of Patent: Aug. 30, 2005

(54) METHOD OF CREATING A MASK-PROGRAMMED LOGIC DEVICE FROM A PRE-EXISTING CIRCUIT DESIGN

(75) Inventors: Jonathan Park, San Jose, CA (US); Eugen Chen, Palo Alto, CA (US); Richard Saito, Sunnyvale, CA (US); Adam Wright, Santa Clara, CA (US); Evgueni Ratchev, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 340 days.

(21) Appl. No.: 10/113,838

(22) Filed: Mar. 29, 2002

(51) Int. Cl.$^7$ .............................................. G06F 17/50
(52) U.S. Cl. ................................ 716/17; 716/4; 716/5; 716/6; 716/12; 716/16
(58) Field of Search ........................... 716/4–6, 16, 12, 716/17, 19, 11

(56) References Cited

U.S. PATENT DOCUMENTS

| | | | | |
|---|---|---|---|---|
| 5,068,603 A | | 11/1991 | Mahoney | 324/158 R |
| 5,212,652 A | | 5/1993 | Agrawal et al. | 364/489 |
| 5,815,405 A | * | 9/1998 | Baxter | 716/3 |
| 5,825,202 A | | 10/1998 | Tavana et al. | 326/39 |
| 5,874,834 A | | 2/1999 | New | 326/39 |
| 5,949,983 A | * | 9/1999 | Baxter | 716/6 |
| 6,018,624 A | * | 1/2000 | Baxter | 703/16 |
| 6,078,735 A | * | 6/2000 | Baxter | 716/3 |
| 6,091,262 A | | 7/2000 | New | 326/39 |
| 6,094,065 A | | 7/2000 | Tavana et al. | 326/39 |
| 6,134,705 A | * | 10/2000 | Pedersen et al. | 716/18 |
| 6,177,844 B1 | | 1/2001 | Sung et al. | 331/25 |
| 6,242,945 B1 | | 6/2001 | New | 326/39 |
| 6,311,316 B1 | | 10/2001 | Huggins et al. | 716/12 |
| 6,490,707 B1 | | 12/2002 | Baxter | 716/2 |
| 6,510,546 B1 | * | 1/2003 | Blodget | 716/16 |
| 6,515,509 B1 | | 2/2003 | Baxter | 326/39 |
| 6,526,563 B1 | | 2/2003 | Baxter | 716/18 |
| 2002/0152060 A1 | * | 10/2002 | Tseng | 703/17 |

OTHER PUBLICATIONS

Xilinx, *HardWire Data Book*, "XC3300 Family HardWire Logic Cell Arrays," Preliminary Product Specification, 1991.

Xilinx, *HardWire Data Book*, pp. 1–1 through 2–28, 1994.

* cited by examiner

*Primary Examiner*—Stacy A. Whitmore
(74) *Attorney, Agent, or Firm*—Fish & Neave IP Group of Ropes & Gray LLP; Robert R. Jackson; Jeffrey C. Aldridge (57) ABSTRACT

A method for creating a mask-programmed device from a preexisting design of a source device is provided. The method includes creating a netlist from a user defined circuit configuration file, configuring logic resources on the mask-programmed device produce basic logic elements, and generating a custom interconnect based on the netlist that interconnects the configured logic resources to produce the desired logic design.

36 Claims, 4 Drawing Sheets

FIG. 4

METHOD OF CREATING A MASK-PROGRAMMED LOGIC DEVICE FROM A PRE-EXISTING CIRCUIT DESIGN

BACKGROUND OF THE INVENTION

The present invention relates to mask programmable logic devices, and more particularly, to methods of creating a mask-programmed logic device from a pre-existing circuit design.

Programmable logic devices (PLDs) are well known. Early programmable logic devices were one-time configurable. For example, configuration may have been achieved by "blowing"—i.e., opening—fusible links. Alternatively, the configuration may have been stored in a programmable read-only memory. These devices generally provided a user with the ability to configure the devices for "sum-of-products" (or "P-TERM") logic operations. Later, such programmable logic devices incorporating erasable programmable read-only memory (EPROM) for configuration became available, allowing the devices to be reconfigured.

Still later, programmable logic devices incorporating static random access memory (SRAM) elements for configuration became available. These devices, which also can be reconfigured, store their configuration information in a nonvolatile memory such as an EPROM, from which the configuration is loaded into the SRAM elements when the device is powered up. These devices generally provide the user with the ability to configure the devices for look-up table-type logic operations. At some point, such devices began to be provided with embedded blocks of random access memory that could be configured by the user to act as random access memory, read-only memory, or logic (such as P-TERM logic).

In all of the foregoing programmable logic devices, both the logic functions of particular logic resources in the device, and the interconnect resources for routing of signals between the logic resources, were programmable. Alternatively, mask-programmable logic devices have been provided. With mask-programmable logic devices, instead of selling all users the same device, a manufacturer produces a base device with a standardized arrangement of logic resources whose functions are not programmable by the user, and which lacks any routing or interconnect resources.

The user provides the manufacturer of the mask-programmable logic device with the specifications of a desired device, which may be the configuration file for programming a comparable conventional programmable logic device ("source PLD"). The manufacturer uses that information to add metallization layers to the base device described above. Those additional layers program the base device's logic resources by making certain connections within those resources, and also add interconnect resources for routing between the logic resources. Mask-programmable logic devices can also be provided with embedded random access memory blocks, as described above in connection with conventional programmable logic devices. In such mask-programmable logic devices, if the embedded memory is configured as read-only memory or P-TERM logic, that configuration is also accomplished using the additional metallization layers.

While conventional programmable logic devices allow a user to easily design a device to perform a desired function, a conventional programmable logic device invariably includes resources that may not be used for a particular design. Moreover, in order to accommodate general purpose routing and interconnect resource, conventional programmable logic devices grow ever larger as more functionality is built into them, increasing the size and power consumption of such devices. The routing of signals through the various switching resources as they travel from one routing and interconnect resource to another also slows down signals.

The advent of mask-programmable logic devices has allowed users to prove a design in a conventional source programmable logic device, but to commit the production version to a mask-programmable logic device which, for the same functionality, can be significantly smaller and use significantly less power, because only the interconnect and routing resources actually needed for the particular design are added to the base device. In addition, there are no general purpose switching resources consuming space or power, or slowing down signals.

However, mask-programmable logic devices do not contain predefined functional logic resources or routing resources. Therefore, the task of programming the customized logic resources and creating the customized interconnect resources for each design falls to the manufacturer in migrating the design of the user's source device to a mask-programmable device. This task is time consuming, and significantly slows down the process of migrating the design and delivering it to the user. The migration process is further complicated by the fact that certain implementation-related problems such as functionality, timing, testability violations, and signal attenuation are not apparent until after an initial mask-programable device is fabricated and tested. Fixing such problems often requires the generation of test benches, test vectors, or timing and functional simulations on the part of the user, and the redesign of the custom interconnect and/or reallocation of logic resources on the base device. One problem with this solution, however, is that it often requires the fabrication of multiple devices to prove a given design and is therefore costly and time consuming.

Accordingly, it would be desirable to provide a method for efficiently implementing a pre-existing circuit design in a mask-programmable device that requires minimal user involvement.

SUMMARY OF THE INVENTION

It is therefore an object of the present invention to provide a method or efficiently implementing a pre-existing circuit design in a mask-programmable device that requires minimal user involvement.

This and other objects of the invention are accomplished in accordance with the principles of the present invention by providing a method for creating a mask-programmed device from a pre-existing design of a source device. The method includes creating a netlist from a user defined circuit configuration file, configuring logic resources on the mask-programmed programmed device to produce basic circuit elements, and generating a custom interconnect based on the netlist that interconnects the configured logic resources to produce the desired circuit design.

Further features of the invention, its nature and various advantages will be more apparent from the accompanying drawings and the following detailed description.

DETAILED DESCRIPTION OF THE PREFERRED EMBODIMENTS

In accordance with the present invention, a method of efficiently producing a mask-programmed logic device from a user's preexisting logic design is provided. This method reduces the amount of time, cost, and effort required to produce a mask-programmed logic device by utilizing a base device architecture that includes at least the same number of logical and functional resources as the devic replaces ("source device"), but that does not rely on interconnection scheme used in the source device. The base device architecture, interconnection, and conversion process are described below in more detail.

Figure 1:
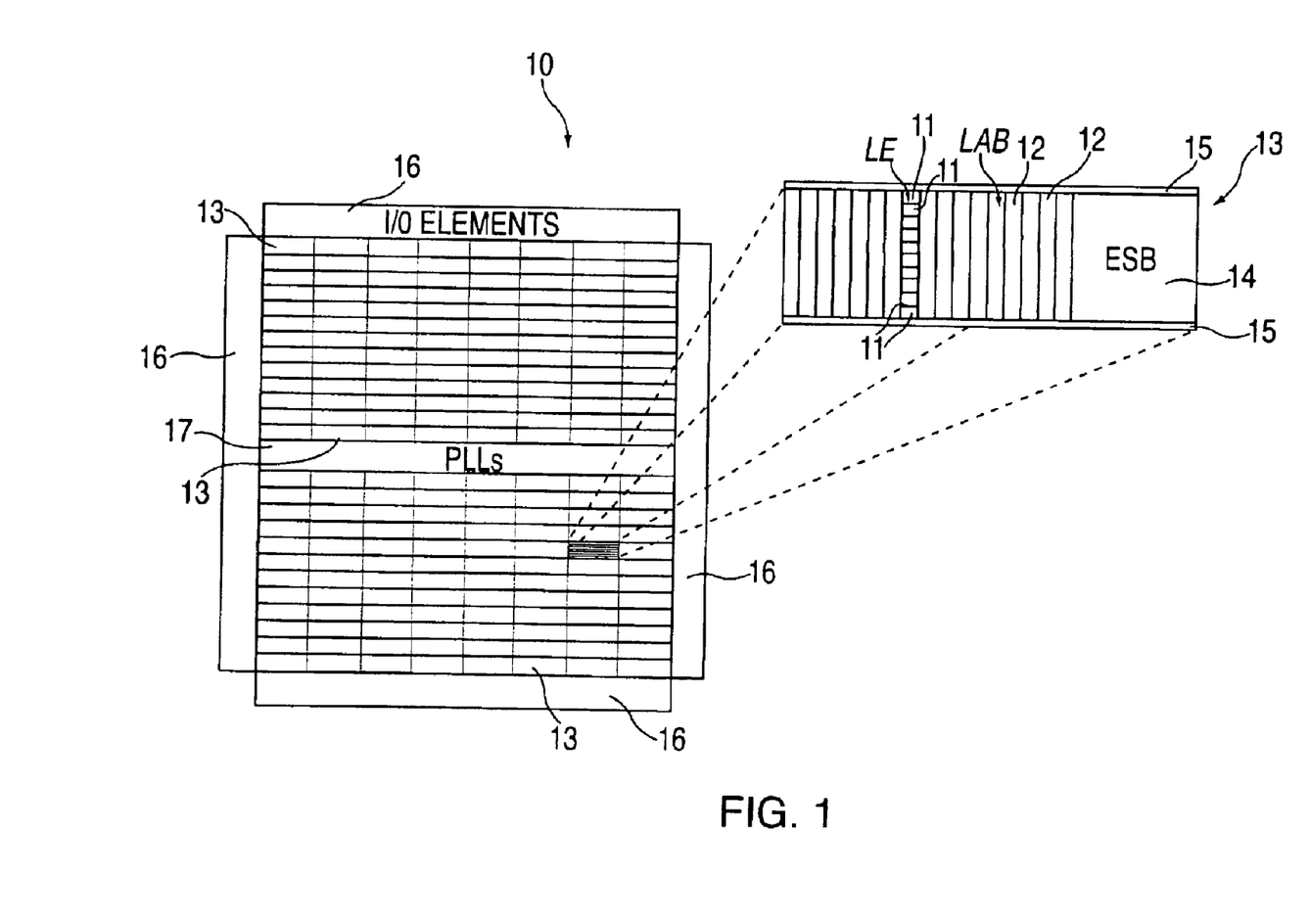
FIG. 1 is a block diagram representation of the layout of a preferred embodiment of a base device in accordance with the present invention.

As seen in FIG. 1, one embodiment of a mask-programmable base device 10 constructed in accordance with the present invention includes an array of logic resources similar to those found in the APEX® family of programmable logic devices (i.e., possible source devices) sold by Altera Corporation, of San Jose, Calif., the assignee hereof. Although an APEX® type architecture is shown, it will be understood that any type of PLD, CPLD (complex programmable logic device) or similar device may serve as a model for the base portion of the mask-programmable device, if desired.

As shown in FIG. 1, the logic resources include, at the most basic level, "logic elements" (LEs) 11, which may be, for example, look-up table-based logic regions having four inputs and the ability to have registered or unregistered outputs. Logic elements 11 may be grouped into "logic array blocks" (LABs) 12. In the embodiment shown, each LAB 12 includes ten LEs 11, although other numbers of LEs 11 could be grouped into each LAB 12. The LABs 12 may further be grouped into "groups of LABs" (GOLs) 13. In the embodiment shown, each GOL 13 includes seventeen LABs 12, although other numbers of LABs 12 could be grouped into each GOL 13. Each GOL 13 preferably also includes an embedded memory block (referred to in the embodiment shown as an "embedded system block" (ESB)) 14. Each GOL 13 may also include a plurality of gate array sites 15, which may be used, e.g., for buffering, delaying, processing, and/or routing particular signals (described in more detail below).

Moreover, it will be understood that LABs 12 need not be organized in GOLs 13, but may be spread throughout base device 10 in regular or irregular patterns. Some of these resources may be external to the core logic array. The specific organization of LEs 11 and LABs 12 on base die 10 is not crucial to the invention.

As shown, GOLs 13 may be arranged in an orthogonal array of rows and columns. "Input/output elements" (I/Os) preferably are located in regions 16 around the periphery of the array. Other auxiliary circuits, such as "phase-locked loops" (PLLs) for timing, etc., preferably are provided at convenient locations within the array, such as in region 17, shown in about the center of the array.

The "architecture" (i.e., the overall organization) of mask-programmable base device 10 may be significantly different from that of a source device such as a source PLD. Although device 10 contains at least the same amount of logic resources (e.g., logic elements, phase-locked loops, I/O elements, etc.) as the source device on which it is based, most of these resources are modified to eliminate their programmability and are physically arranged and placed in different relative positions. For example, the PLLs that are usually located at the periphery of a source device are shown in FIG. 1 to be positioned in the middle of device 10 to improve noise immunity and optimize performance in the smaller mask-programmable device. The removal of configuration logic and routing resources causes GOLs 13 to shrink more significantly in one dimension. To maintain a more square shaped device, which may be easier to manufacture and assemble than a long rectangular device, the above-described orthogonal array of rows and columns may be "folded over" such that it has twice as many rows and half as many columns as the source device (e.g., it may be twice as long in the x direction as compared to the y direction or vice versa). This arrangement may also result in a double column of I/O cells on each side of device 10, a significant difference from many source device I/O arrangements. Furthermore, not every logic resource available on the source device may be utilized in the user's design. Therefore, better power performance may be obtained because only the used circuit blocks are implemented in the mask-programmed device. The unused logic resources may not be powered up even though they are available for a different design implementation on base device 10.

As mentioned above, base device 10 and the source device use substantially different interconnect schemes. Source devices, such as PLDs, traditionally have large numbers of general purpose routing conductors to provide routing flexibility and to ensure that the maxium amount of logic resources on the chip is utilized. Signals are routed on the chip by programming programmable logic connectors (multiplexers configured with SRAM cells in this case) to interconnect portions of logic circuitry on the PLD to obtain a specific circuit design. This type of arrangement is used to provide the "programmability" of the PLD so that it may accept a wide range of circuit designs. In complex PLDs, these routing resources take up a large portion of the die area. The majority of these fixed resources are often unused in any specific design and thus can be elimnated in mask-programmable base device 10. By building a customized interconnect network on each base device 10, a significant die size savings may be realized. This interconnect network may be implemented through mask programming of metallization layers added on top of the base device. Some of the benefits associated with the customized interconnect network include reduced die size and reduced internal capacitive loading compared to the source PLD.

Figure 2:
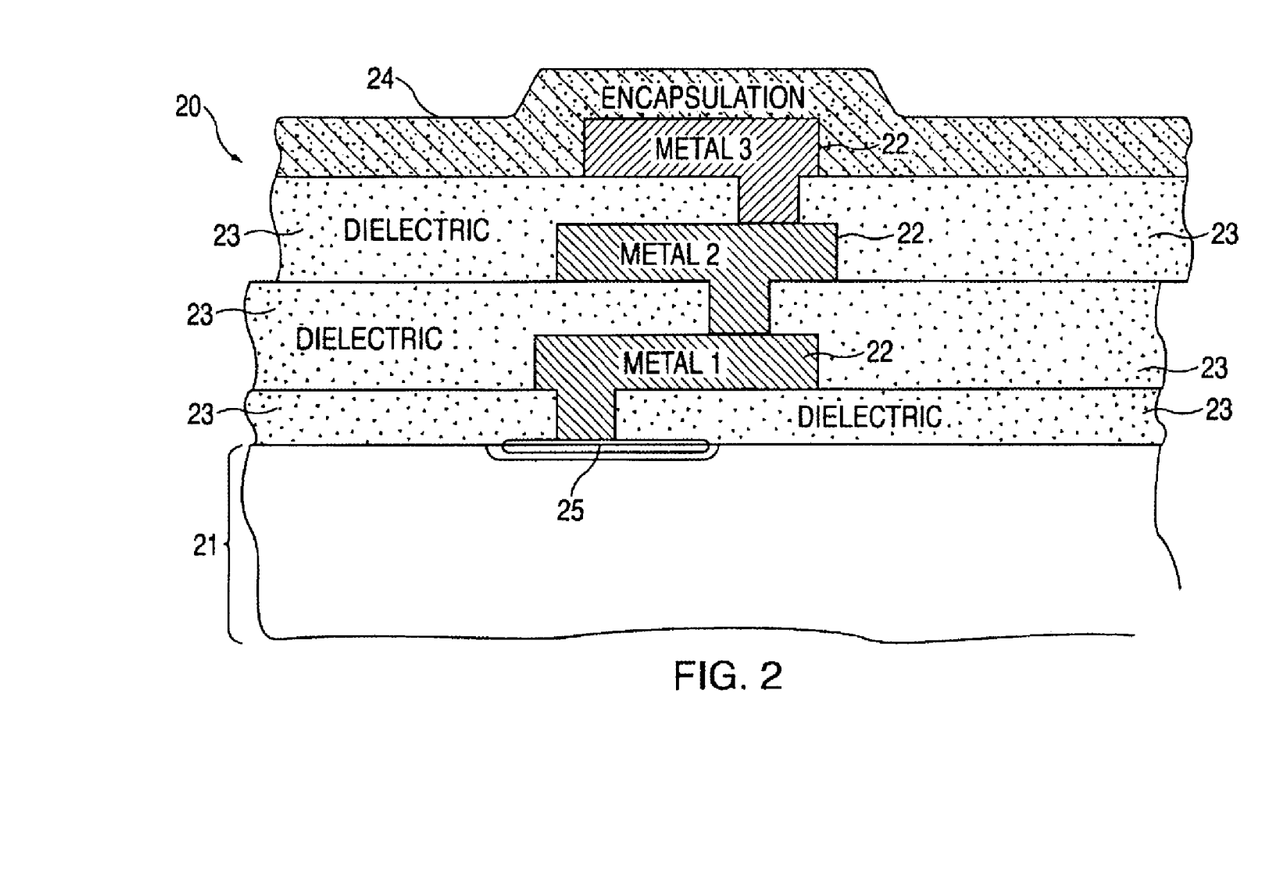
FIG. 2 is a cross-sectional view of the substrate and mask metallization layers of a mask-programmed device according to the present invention, incorporating the device of FIG. 1.

FIG. 2 shows a cross-section of mask-programmable base device 10 after programming (i.e., after it has become a "mask-programmed" device 20), in which the substrate and other layers that make up the unprogrammed base device 10 are shown collectively at 21 (one transistor 25 is shown as representative). Additional layers of metallization 22 and dielectric 23 are used to program device 20 and create a custom interconnect network that connects the resources included in base device 10. Commonly, an encapsulation layer 24 is provided to protect metallization and dielectric layers 22 and 23. Therefore, mask-programmed logic device 20 may be built on mask-programmable base device 10 that has the same logic elements, memory, I/Os, and PLLs as the source device from which it was converted, yet does not necessarily have the same architecture as the source device. In some embodiments, however, the architecture may remain the same and be coverted to mask-programmed device by the methods described herein.

The conversion process of the present invention takes advantage of the fact that mask-programmable base device 10 has at least the same logic and functional resources as its source device and it is not constrained by the prior location of these resources except to the extent that device 10 should be pin compatible and should meet the critical timing constrains of the source device.

Figure 3:
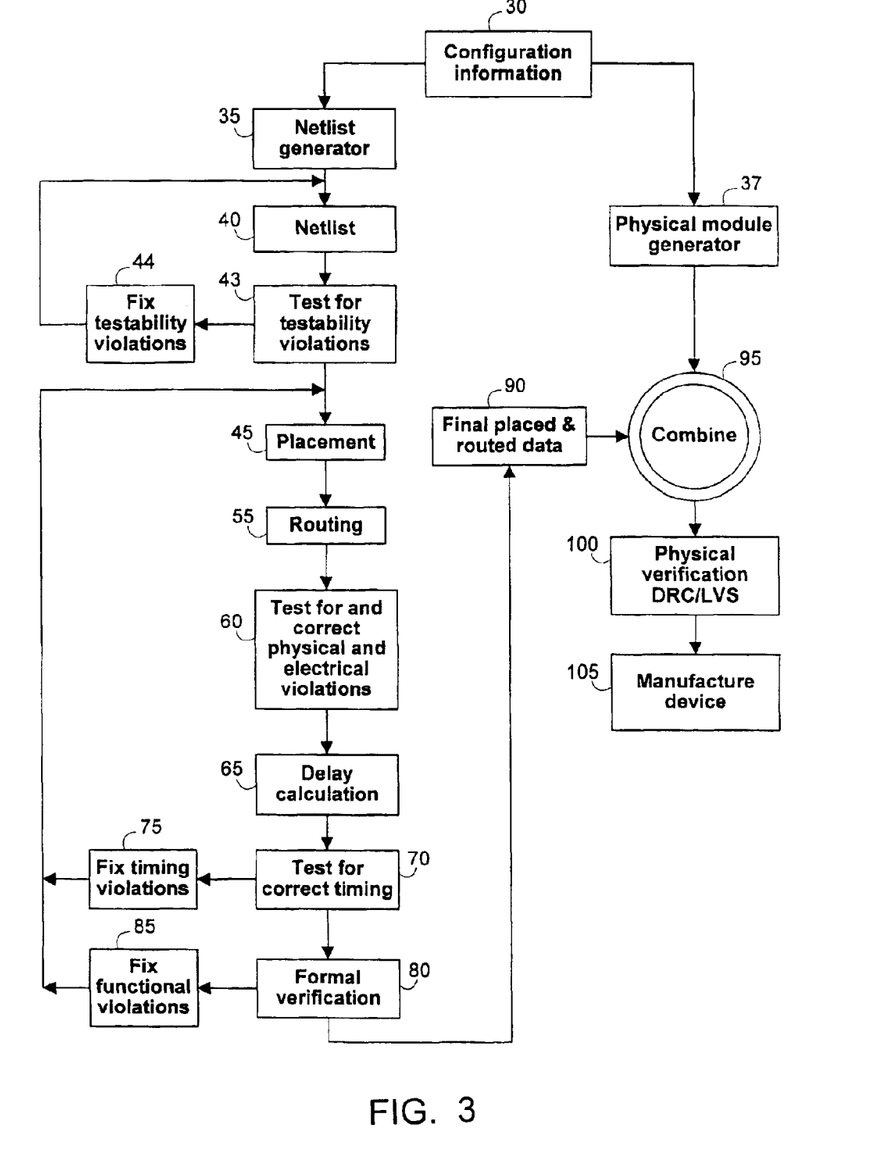
FIG. 3 is a flow chart illustrating some of the steps involved in converting preexisting circuit design into a mask-programmed device according to the present invention.

FIG. 3 shows a conversion flow diagram for the above-mentioned method of producing mask-programmed logic device 20 from a pre-existing circuit design. Initially, the user provides the manufacturer with information regarding configuration and the desired timing requirements of the source device (step 30). Configuration information may be supplied about the source device, such as a PLD, in a computer generated configuration file such as an SRAM Object File (.sof file) generated by Altera's Quartus® II software. This file typically includes both connectivity information and information about the physical configuration of logic resources. The configuration file is provided to a netlist generator at step 35 and a physical module generator at step 37. Connectivity information contained in the configuration file is extracted by the netlist generator and a structural netlist 40 such as a Verilog® netlist is created. Netlist 40 contains information describing both the logic function and connectivity of the source device, but preferably does not retain information relating to the physical placement of logic resources.

Next, at step 43, netlist 40 may be scanned for testability violations. At this point, test structures may be added to correct any detected violations, to allow for fault testing, and to provide further visibility into the operation of the completed mask-programmed device 20 (step 44). Steps 43 and 44 may be repeated until all testability violations are corrected.

At step 37, the physical module generator determines how to physically configure the logic resources such as LEs 11 so that they perform required logic functions. In some embodiments, this operation may be based on configuration bits provided by the configuration file at step 30. Physical configuration typically involves determining how to mask program (i.e., connect) certain nodes within a logic resource, such as an LE 11, to obtain a desired logic function. For example, certain nodes may be coupled to a power plane (logic high) or a ground plane (logic low) in order to configure the logic resources to provide the desired logic function. This may be thought of as the first step of physically programming device 10 (i.e., determining how to the logic resources to produce the desired logic function). The functionality and physical integrity of these "programmed modules" may be verified as they are generated, therefore, a logic simulation verifying the functionality of the modules may not be needed. Step 37 is typically performed concurrently with steps 35–80.

Information in netlist 40 describes the function of each circuit block on the source device (e.g., I/O, LE, ESB, and PLL blocks in a PLD) and how each block is connected to other circuit blocks. At step 45, a placement routine assigns specific portions of the source device's design to particular portions of base device 10. Placement of logic resources (e.g., LABs 12) may be based on a variety of factors such as constraints imposed by interconnection requirements, timing requirements, and by pin compatibility with the source device. One purpose of the placement routine is to optimize the location of logic resources on mask-programmed device 20 to ensure its performance characteristics are equal to or better than those achieved by the source device.

In certain embodiments, it may be desirable to preserve portions of the source device's layout to eliminate the need for translation or synthesis of the circuit design. This may be done in instances where the source device and the mask-programmable device share a virtually identical logic resource architecture. For example, in the case of converting a PLD, the LABs 12 used in the source PLD may be imported and placed as LABs 12 on the mask-programmable device without being further broken down into smaller elements (e.g., LEs 11) because the LABs share the same layout. This allows the placement routine to assign portions of the source device's design on a LAB by LAB basis and thereby avoid further processing that would be necessary to implement the circuit design by placing fundamental logic blocks. It should be noted, however, that in many cases, LABs 12 end up in different locations on mask-programmed device 20 as compared to the source PLD because placement is done irrespective of location on the source device. It will be understood, however, that placement may be done at the LE level so long as the LE structure within the LABs is maintained but this will generally take longer and will require more involved testing procedures.

After the placement of logic resources is complete, the resulting placement information is converted into a physical coordinate data file that represents the physical locations of the circuit blocks on base device 10 (step 45). This information is used to determine how to interconnect the logic resources placed at step 45 to form the required circuit design. Such interconnections are provided in the appropriate mask metallization layers above base device 10 (e.g., see metallization layers 22 in FIG. 2). This may be thought of as the second step of physically programming device 10 (i.e., identifying the placement of the logic resources that are concurrently being configured at step 37 and need to be interconnected at step 55 to produce the desired logic design). The placement of all I/O cells 16 are typically fixed on the periphery of base device 10.

Next, at step 55, a routing routine generates a customized interconnection network used to interconnect the logic resources placed above. The routing routine uses connectivity information derived from netlist 40 and the physical coordinate information generated above to determine optimal ways for connecting the logic resources placed at step 45. This may be thought of as the third step of physically programming device 10 (i.e., connecting the logic resources placed above). Ultimately, the customized interconnect is implemented in the metallization layers above base device 10 (shown in FIG. 2 as metallization layers 22). The placement and routing steps described above may be performed in a manner similar to that used in known software for configuring PLDs.

One benefit associated with using a customized interconnect is that significantly less routing resources are used as compared to the source PLD because only the necessary interconnect is generated (i.e., none of the unused general purpose routing conductors on the source PLD are found in the customized interconnect.) In addition, all of the programmable logic connectors used in the source PLD are removed, significantly decreasing the power consumption and size of the mask-programmed device 20.

At this point, a software file representative of both the placement and interconnect of logic resources is complete.

This representation may be used to check for physical design violations such as excessive fanout or antenna violations (step 60). For example, a test of this design representation may reveal that a node associated with a certain LE 11 has an excessive fanout which may cause a slow response time or increased power consumption. This problem may be corrected by the insertion of buffer circuitry into the burdened circuit path to increase signal strength. Such buffer circuitry may then be added to netlist 40 at step 60. Buffer circuitry may be created by programming some of the above-mentioned gate array sites 15, as described in the commonly assigned, co-pending patent application entitled "Mask-Programmable Logic Devices With Programmable Gate Array Sites" Ser. No. 10/113,324, which is hereby incorporated by reference in its entirety.

After step 60 is complete, interconnect parasitic capacitance and resistance information may be generated on the resulting circuit layout (step 65). This information may be converted into a Standard Delay Format File (.sdf file) with a delay calculation tool to estimate propagation delays. Both minimum and maximum delays may be estimated to identify potential Setup time violations (signals that are too slow and therefore don't meet the user's specified timing requirements) and/or Hold time violations (signals that are too fast and may not be processed properly).

Next, at step 70, the timing of the emerging circuit design may be analyzed and corrected after steps 45–65 using the information generated at step 65. Timing violations may be identified by comparing the timing requirements provided by the user to those estimated at step 65. Setup time violations may be corrected in several ways. For example, additional buffers may be used as described above to speed up signals, or if necessary, placement can be re-optimized by returning to step 45. Hold time violations may be corrected by the insertion of delay elements. These delay and buffer elements may be created by programming the above-mentioned gate array sites 15.

If any new elements have been added to netlist 40 to correct timing or design violations, the appropriate corrections should be implemented in netlist 40 at step 75. Afterwards, placement step 45 and routing step 55 should be reiterated to reflect these changes to netlist 40, followed by another iteration of testing for timing violations through step 70. Typically, only one iteration is necessary after the initial place and route.

If no timing violations are observed at step 70, the integrity of netlist 40 may be verified through static functional verification techniques that involve confirming that two versions of a design are functionally identical when certain constraints are applied (step 80). For example, original netlist 40 should be logically equivalent to a netlist 40 modified to correct for timing and/or design rule violations. This technique does not rely on any user-supplied simulation vectors. If the two versions of netlist 40 are not found to be functionally identical, then appropriate corrections are implemented in netlist 40 at step 85 to ensure functional equivalence (e.g., adding or removing certain circuits, etc.). Steps 45 through 70 are then reiterated until a satisfactory circuit design is produced.

At this point, the placement and routing of the circuit design is complete (step 90). At step 95, a software file representntg the circuit design developed from steps 40–80 is combined with a physical configuration file produced at step 37, completing the circuit design that is to be implemented in the mask-programmable device 20. This combination includes combining the physical configuration file produced at step 37 that contains the interconnection information specifying the particular configuration of each of the logic resources placed at step 45 and routed at step 55. This produces, for example, the exact physical coordinates of all logic resources that need to be interconnected on device 10 to produce a particular circuit design. It also includes the physical coordinates of all the interconnect paths that need to be generated in the mask layers to provide the necessary interconnection.

Before manufacturing the customized metal interconnect, however, the physical layout may be verified. This typically involves checking for design rule violations and also ensuring that the interconnect was physically implemented correctly (step 105). These processes are sometimes known as design rule checks (DRCs) and layout versus schematic verification (LVS). At this point, the metal interconnect is generated and coupled to base device 10 to produce mask-programmed device 20 (step 100). Following step 105 additional steps may be performed to ensure device 20 operates properly, including, for example using scan chain technology to observe certain nodes within device 20 (not shown).

It will be appreciated that the ability to create mask-programmed logic devices 20 from pre-existing logic designs provides circuit designers with a cost effective short cycle-time alternative to costly application-specific integrated circuit technolgies (ASICs). Furthermore, the ability to produce mask-programmed devices as described above allows circuit designers to combine logic designs from smaller capacity PLDs, such as Altera's® 400, 600, 800, 1000, 8K, 10K, and 20K products or similar devices, and replace them with a single mask-programmable device 20, which saves board area and reduces overall power consumption.

Figure 4:
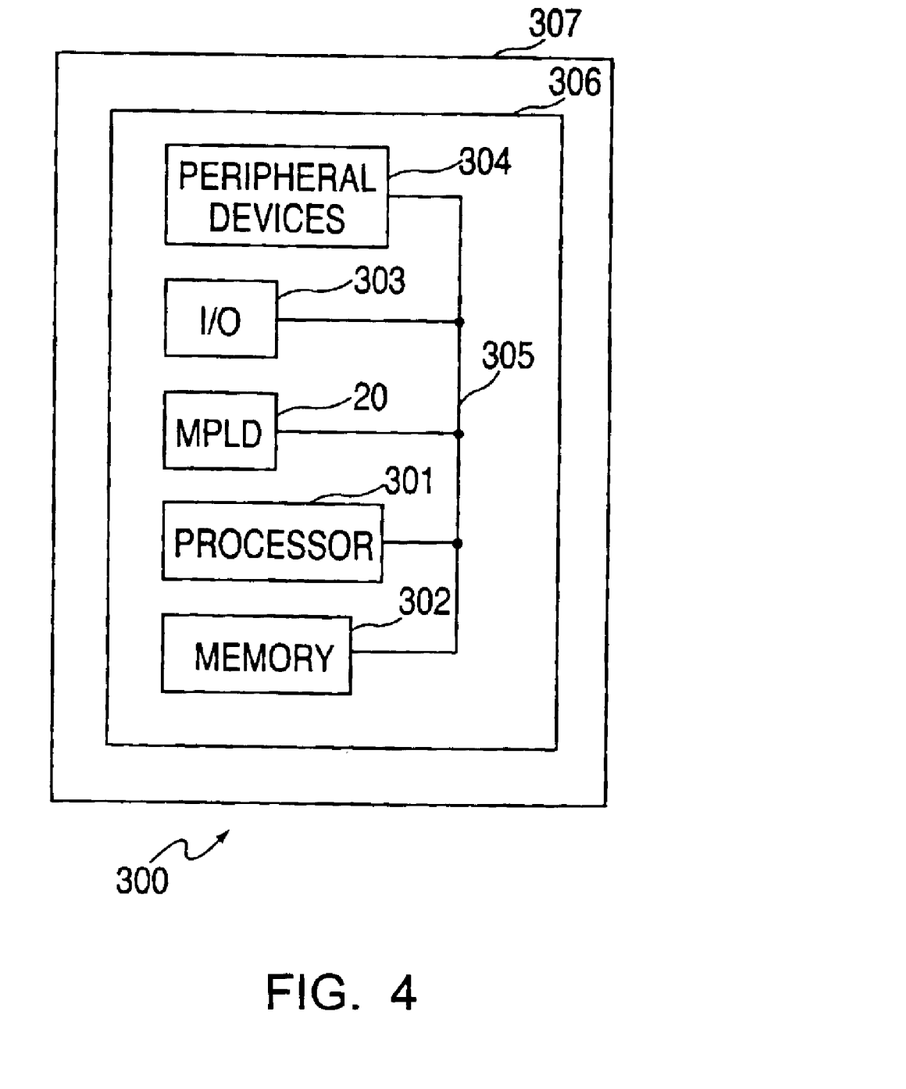
FIG. 4 is a simplified block diagram of an illustrative system employing a mask-programmed logic device in accordance with the present invention.

Mask-programmed logic device 20 constructed according to the method described above may be used as part of a data processing system 300 shown in FIG. 4. Data processing system 300 may include one or more of the following components: a processor 301; memory 302; I/O circuitry 303; and peripheral devices 304. These components are coupled together by a system bus 305 and are populated on a circuit board 306 which is contained in an end-user system 307.

System 300 can be used in a wide variety of applications, such as computer networking, data networking, instrumentation, video processing, digital signal processing, or any other application where the advantage of using mask-programmable logic is desirable. Mask-programmed logic device 20 can be configured to perform a variety of different logic functions. For example, mask-programmed logic device 20 can be configured as a processor or controller that works in cooperation with processor 301. Mask-programmed logic device 20 may also be used as an arbiter for arbitrating access to a shared resources in system 300. In yet another example, mask-programmed logic device 20 can be configured as an interface between processor 301 and one of the other components in system 300. It should be noted that system 300 is only exemplary, and that the true scope and spirit of the invention should be indicated by the following claims.

Various integrated circuit process technologies can be used to implement mask-programmed logic devices 20 as described above according to this invention. In addition, other known programming techniques such as fuse based programming could be substituted for the mask programming discussed in detail and still practice the principles of the invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A method of designing a mask-programmable device comprising:
   receiving a circuit configuraton file representing a circuit design;
   generating a netlist based on the configuration file;
   configuring logic resources for implementation on a base device from information in the configuration file;
   generating a custom interconnect design based on the netlist that interconnects the logic resources configured in the configuring step;
   testing for a physical design violation; and
   correcting the physical design violations, if any, by configuring a gate array site to function as a buffer circuit and coupling the buffer circuit to circuitry in the netlist identified as causing the physical design violation in the testing step.

2. The method of claim 1 wherein the configuring further comprise assigning certain nodes to be coupled to a logic low level based on configuration bits in the configuration file.

3. The method of claim 1 wherein the configuring further comprises assigning certain nodes to be coupled to a logic high level based on configuration bits in the configuration file.

4. The method of claim 1 further comprising placing at least some sections of circuitry on the netlist to corresponding sections on the mask-programmable device.

5. The method of claim 4 characterized by the use of logic array blocks (LABs) as circuit sections.

6. The method of claim 4 further comprising optimizing placement of the circuit sections.

7. The method of claim 1 further comprising updating the netlist to include the buffer circuitry added to the circuit design in the correcting step.

8. The method of claim 7 further comprising:
   retesting for physical design violations to determine if the correcting step corrected the physical design violation detected in the testing step;
   configuring additional gate array circuits to function as buffers if the retesting step reveals that additional physical design violations exist and coupling the additional buffer circuits to circuitry in the netlist identified as causing the physical design violation in the retesting step; and
   repeating the retesting and configuration steps until all physical design violations detected are corrected.

9. The method of claim 7 further comprising:
   retesting for physical design violations to determine if the correcting step corrected the physical design violations detected in the testing step;
   rearranging the placement of logic resources on the mask-programmable device;
   regenerating the interconnect; and
   testing again for physical design violations to determine if the rearranging and regenerating steps corrected the physical design violations detected in the retesting step.

10. A method of designing a mask-programmable device comprising:
    receiving a circuit configuration file representing a circuit design;
    generating a netlist based on the configuration file;
    configuring logic resources for implementation on a base device from information in the configuration file;
    generating a custom interconnect design based on the netlist that interconnects the logic resources configured in the configuring step;
    testing for Setup time violations; and
    correcting the Setup time violations, if any, by configuring a gate array site to function as a buffer circuit and coupling the buffer circuit to circuitry in the netlist identified as causing the Setup time violation in the testing step, wherein the receiving further comprises receiving timing information about the circuit design.

11. The method of claim 10 further comprising updating the netlist to include the buffer circuitry added to the circuit design in the correcting step.

12. The method of claim 11 further comprising:
    retesting for Setup time violations to determine if the correcting step corrected the Setup time violation detected in the testing step; and
    configuring additional gate array circuits to function as buffers if the retesting step reveals that additional Setup time violations exist and coupling the additional buffer circuits to circuitry in the netlist identified as causing the Setup time violation in the retesting step; and
    repeating the retesting and configuration steps until all Setup time violations detected are corrected.

13. A method of designing a mask-programmable device comprising:
    receiving a circuit configuration file representing a circuit design;
    generating a netlist based on the configuration file;
    configuring logic resources for implementation on a base device from information in the configuration file;
    generating a custom interconnect design based on the netlist that interconnects the logic resources configured in the configuring step;
    testing for Hold time violations; and
    correcting the Hold time violations, if any, by configuring a gate array site to function as a delay circuit and coupling the delay circuit to circuitry in the netlist identified as causing the Hold time violation in the testing step, wherein the receiving further comprises receiving timing information about the circuit design.

14. The method of claim 13 further comprising updating the netlist to include the delay circuitry added to the circuit design in the correcting step.

15. The method of claim 14 further comprising:
    retesting for Hold time violations to determine if the correcting step corrected the Hold time violation detected in the testing step;
    configuring additional gate array circuits to function as delays if the retesting step reveals that additional Hold time violations exist and coupling the additional delay circuits to circuitry in the netlist identified as causing the Hold time violation in the retesting step; and
    repeating the retesting and configuration steps until all Hold time violations detected are corrected.

16. A method for designing a mask-programmable logic device from a pre-existing programmable logic device circuit design comprising:
    receiving a configuration file representing the pre-existing programmable logic device circuit design;
    receiving a timing file that includes information about the timing requirements of the programmable logic device circuit design;

generating a netlist based on the configuration file;
creating placement information that assigns at least some sections of circuitry on the netlist to corresponding sections on the mask-programmable device;
configuring logic resources for implementation on a base device from the configuration file and the placement information; and
generating a custom interconnect based on the netlist that interconnects the logic resources configured in the configuring step, wherein the creating further comprises generating physical coordinate data representing specific locations on the base device.

17. The method of claim 16 wherein the configuring further comprises generating interconnection information representing how specific logic resources are interconnected to provide a logic function.

18. The method of claim 16 further comprising calculating the delay associated with at least some of the circuits created by interconnecting the configured logic resources.

19. The method of claim 18 further comprising comparing the timing requirements of the programmable logic device design with the delay calculated for corresponding circuits in the mask-programmable logic device to determine if there is a design violation.

20. The method of claim 16, wherein the base device has at least as many logic resources and functional blocks as the pre-existing programmable logic device.

21. A method for designing a mask-programmable logic device from a pre-existing programmable logic device circuit design comprising:
receiving a configuration file representing the pre-existing programmable logic device circuit design;
receiving a timing file that includes information about the timing requirements of the programmable logic device circuit design;
generating a netlist based on the configuration file;
creating placement information that assigns at least some sections of circuitry on the netlist to corresponding sections on the mask-programmable device;
configuring logic resources for implementation on a base device from the configuration file and the placement information;
generating a custom interconnect based on the netlist that interconnects the logic resources configured in the configuring step;
calculating the delay associated with at least some of the circuits created by interconnecting the configured logic resources;
comparing the timing requirements of the programmable logic device design with the delay calculated for corresponding circuits in the mask-programmable logic device to determine if there is a design violation; and
correcting the design violations, if any, by configuring a gate array site to function as a buffer circuit and connecting the buffer circuit to circuitry identified as causing the Setup time violation in the testing step.

22. The method of claim 21 further comprising updating the netlist to include the buffer circuitry added to the circuit design in the correcting step.

23. The method of claim 22 further comprising:
testing for design violations to determine if the correcting step corrected the design violation detected in the comparing step;
configuring additional gate array circuits to function as buffers if the testing step reveals that additional design violations exist and coupling the additional buffer circuits to circuitry in the netlist identified as causing the design violation in the testing step; and
repeating the testing and configuration steps until all design violations detected are corrected.

24. A method for designing a mask-programmable logic device from a pre-existing programmable logic device circuit design comprising:
receiving a configuration file representing the pre-existing programmable logic device circuit design;
receiving a timing file that includes information about the timing requirements of the programmable logic device circuit design;
generating a netlist based on the configuration file;
creating placement information that assigns at least some sections of circuitry on the netlist to corresponding sections on the mask-programmable device;
configuring logic resources for implementation on a base device from the configuration file and the placement information; and
generating a custom interconnect based on the netlist that interconnects the logic resources configured in the configuring step, wherein the designing process causes some of the logic resources to be placed in different locations compared to the programmable logic device based on placement constraints, timing constraints, or I/O assignments.

25. The method of claim 20 wherein the logic resources comprise logic elements and logic array blocks, and wherein logic elements of the programmable logic device design are maintained in the same logic array block on the base device even though the logic array blocks are placed in different locations on the base device.

26. The method of claim 24 wherein the logic resources comprise logic elements and logic array blocks, and wherein the logic elements are placed into logic array blocks that are different from the logic array blocks that the logic elements were located in on the pre-existing programmable logic device design.

27. A method for designing a mask-programmable logic device from a pre-existing programmable logic device circuit design comprising:
receiving a configuration file representing the pre-existing programmable logic device circuit design;
receiving a timing file that includes information about the timing requirements of the programmable logic device circuit design;
generating a netlist based on the configuration file;
creating placement information that assigns at least some sections of circuitry on the netlist to corresponding sections on the mask-programmable device;
configuring logic resources for implementation on a base device from the configuration file and the placement information; and
generating a custom interconnect based on the netlist that interconnects the logic resources configured in the configuring step, wherein one base device is used to replace multiple programmable logic devices of lesser capacity.

28. A method for designing a mask-programmable logic device from a pre-existing programmable logic device circuit design comprising:
receiving a configuration file representing the pre-existing programmable logic device circuit design;
receiving a timing file that includes information about the timing requirements of the programmable logic device circuit design;

generating a netlist based on the configuration file;
creating placement information that assigns at least some sections of circuitry on the netlist to corresponding sections on the mask-programmable device;
configuring logic resources for implementation on a base device from the configuration file and the placement information; and
generating a custom interconnect based on the netlist that interconnects the logic resources configured in the configuring step, wherein the logic resources are arrayed on the base device in a row and column arrangement that is different than the row and column arrangement of the pre-existing programmable logic device.

29. A method for designing a mask-programmable logic device from a pre-existing programmable logic device circuit design comprising:
receiving a configuration file representing the pre-existing programmable logic device circuit design;
receiving a timing file that includes information about the timing requirements of the programmable logic device circuit design;
generating a netlist based on the configuration file;
creating placement information that assigns at least some sections of circuitry on the netlist to corresponding sections on the mask-programmable device;
configuring logic resources for implementation on a base device from the configuration file and the placement information; and
generating a custom interconnect based on the netlist that interconnects the logic resources configured in the configuring step, wherein the base device has at least as many logic resources and functional blocks as the pre-existing programmable logic device, and wherein the functional blocks are located in a different location base device array than on the pre-existing programmable logic device.

30. A method for designing a mask-programmable logic device from a pre-existing programmable logic device circuit design comprising:
receiving a configuration file representing the pre-existing programmable logic device circuit design;
receiving a timing file that includes information about the timing requirements of the programmable logic device circuit design;
generating a netlist based on the configuration file;
creating placement information that assigns at least some sections of circuitry on the netlist to corresponding sections on the mask-programmable device;
configuring logic resources for implementation on a base device from the configuration file and the placement information; and
generating a custom interconnect based on the netlist that interconnects the logic resources configured in the configuring step, wherein the logic resources comprise logic elements and logic array blocks, and wherein the logic array blocks are maintained in the same hierarchical structure as they are in the pre-existing programmable logic device design.

31. A mask-programmable logic device configured to facilitate the conversion of a source pre-existing programmable logic device design into the mask-programmable device, comprising:
a base die having at least as many logic resources and functional blocks as the programmable logic device, but without the general purpose interconnection conductors of the source programmable logic device, wherein:
the logic resources of the mask-programmable logic device do not include programmable elements, which causes a row-column logic array structure of the base die to be different from the row-column logic array structure of the programmable logic device, and
a custom interconnect network is generated and coupled to the base die to interconnect the logic resources based on a programmable logic device conversion process.

32. The base die of claim 31, wherein the logic resources are logic array blocks, and wherein the logic array blocks on the base die have different x-y dimensions than the logic array blocks on the programmable logic device because the logic array blocks on the base die do not include programmable logic connectors.

33. The base die of claim 32, wherein the row-column logic array structure of the logic resources on the base die is modified based on the different x-y dimension to maintain a relatively square die for process considerations.

34. The base die of claim 31, wherein the functional blocks are in the same relative locations with respect to the logic resources as compared to the layout of the programmable logic device.

35. The base die of claim 31, wherein the functional blocks on the base die are in the different relative locations with respect to the logic resources as compared to the layout of the programmable logic device.

36. The base die of claim 31, wherein phase-locked loop circuitry is placed in the middle of the array to reduce noise susceptibility.

* * * * *